(12) United States Patent
Terashima et al.

(10) Patent No.: US 11,473,176 B2
(45) Date of Patent: Oct. 18, 2022

(54) ORIENTED ELECTRICAL STEEL SHEET AND METHOD FOR PRODUCING SAME

(71) Applicant: JFE Steel Corporation, Tokyo (JP)

(72) Inventors: Takashi Terashima, Tokyo (JP); Karin Kokufu, Tokyo (JP); Toshito Takamiya, Tokyo (JP)

(73) Assignee: JFE Steel Corporation, Tokyo (JP)

(*) Notice: Subject to any disclaimer, the term of this patent is extended or adjusted under 35 U.S.C. 154(b) by 0 days.

(21) Appl. No.: 16/766,090

(22) PCT Filed: Oct. 12, 2018

(86) PCT No.: PCT/JP2018/038133
§ 371 (c)(1),
(2) Date: May 21, 2020

(87) PCT Pub. No.: WO2019/106976
PCT Pub. Date: Jun. 6, 2019

(65) Prior Publication Data
US 2020/0354821 A1 Nov. 12, 2020

(30) Foreign Application Priority Data
Nov. 28, 2017 (JP) .............................. JP2017-228001

(51) Int. Cl.
C22C 38/00 (2006.01)
H01F 1/18 (2006.01)
(Continued)

(52) U.S. Cl.
CPC ............ *C22C 38/00* (2013.01); *C21D 8/0205* (2013.01); *C21D 8/0226* (2013.01);
(Continued)

(58) Field of Classification Search
CPC ........ C21D 6/005; C21D 6/008; C21D 8/005; C21D 8/0205; C21D 8/0226;
(Continued)

(56) References Cited

U.S. PATENT DOCUMENTS 3,856,568 A 12/1974 Tanaka et al.
3,985,583 A 10/1976 Shimanaka et al.
(Continued)

FOREIGN PATENT DOCUMENTS

CN 1048554 A 1/1991
CN 101541991 A 9/2009
(Continued)

OTHER PUBLICATIONS

C-C. Kuo et al., "High Temperature Wear Behavior of Titanium Nitride Coating Deposited Using High Power Impulse Magnetron Sputtering", 2019, Coatings, 9, 555, p. 1-13. (Year: 2019).*
(Continued)

Primary Examiner — Adam Krupicka
(74) Attorney, Agent, or Firm — RatnerPrestia

(57) ABSTRACT

Provided are: an oriented electrical steel sheet having a high tension applied to a steel sheet and excellent adhesion to a film; and a method for producing the same. This oriented electrical steel sheet includes: a steel sheet; a film A containing a crystalline material disposed on the steel sheet; and a film B containing a vitreous material disposed on the film A, wherein an element profile, which is obtained by using a high-frequency glow discharge light-emission surface analysis method, in the direction from the film B to the steel sheet satisfies formulae (1) and (2). $0.35 \leq (t_A/t_{Fe/2}) \leq 0.75$ ... (1), $0.25 \leq (t_{A/2}/t_{Fe/2}) \leq 1.00$ ... (2), where $t_A$ represents the peak time of an alkali metal element profile, $t_{A/2}$ represents the half time of an alkali metal.

12 Claims, 1 Drawing Sheet

(51) Int. Cl.

| | | |
|---|---|---|
| *C21D 8/02* | (2006.01) | |
| *C21D 9/46* | (2006.01) | |
| *C23C 14/06* | (2006.01) | |
| *C23C 14/08* | (2006.01) | |
| *C23C 14/10* | (2006.01) | |
| *C23C 14/16* | (2006.01) | |
| *C23C 14/34* | (2006.01) | |
| *C23C 16/30* | (2006.01) | |
| *C23C 16/40* | (2006.01) | |

(52) U.S. Cl.
CPC ............ *C21D 8/0236* (2013.01); *C21D 9/46* (2013.01); *C23C 14/0641* (2013.01); *C23C 14/08* (2013.01); *C23C 14/10* (2013.01); *C23C 14/16* (2013.01); *C23C 14/34* (2013.01); *C23C 16/303* (2013.01); *C23C 16/40* (2013.01); *C21D 2201/05* (2013.01)

(58) Field of Classification Search
CPC ...... C21D 8/0236; C21D 8/12; C21D 8/1222; C21D 8/1233; C21D 8/1277; C21D 8/1283; C21D 8/1288; C21D 9/46; C21D 2201/05; C22C 38/00; C22C 38/001; C22C 38/02; C22C 38/04; C22C 38/06; C22C 38/60; C23C 4/02; C23C 4/10; C23C 4/134; C23C 14/0641; C23C 14/08; C23C 14/10; C23C 14/16; C23C 14/34; C23C 16/303; C23C 16/40; C23C 24/04; C23C 28/04; C23C 28/042; H01F 1/147; H01F 1/14783; Y10T 428/12576; Y10T 428/24917; Y10T 428/252; B32B 15/18; B32B 2250/03

See application file for complete search history.

(56) References Cited

U.S. PATENT DOCUMENTS

| | | | |
|---|---|---|---|
| 4,698,272 A | 10/1987 | Inokuti et al. | |
| 5,174,833 A | 12/1992 | Tanaka et al. | |
| 5,753,051 A | 5/1998 | Kanai et al. | |
| 6,280,862 B1 * | 8/2001 | Inokuti ............... | H01F 1/14783 428/167 |
| 6,287,392 B1 * | 9/2001 | Toda ................ | C21D 8/12 148/111 |
| 2008/0190520 A1 | 8/2008 | Watanabe et al. | |
| 2010/0055481 A1 | 3/2010 | Kubo | |
| 2015/0024222 A1 | 1/2015 | Sauer et al. | |
| 2016/0260531 A1 | 9/2016 | Terashima et al. | |
| 2017/0233842 A1 | 8/2017 | Yashiki et al. | |
| 2018/0119244 A1 * | 5/2018 | Omura ............... | C22C 38/008 |
| 2019/0186018 A1 | 6/2019 | Takeda et al. | |
| 2019/0333662 A1 * | 10/2019 | Terashima ............ | H01F 27/34 |

FOREIGN PATENT DOCUMENTS

| | | |
|---|---|---|
| CN | 106661696 A | 5/2017 |
| EP | 2826569 A1 | 1/2015 |
| GB | 1234181 A | 6/1971 |
| JP | 4839338 A | 6/1973 |
| JP | 5079442 A | 6/1975 |
| JP | 0867913 A | 3/1996 |
| JP | 08325745 A | 12/1996 |
| JP | 11071683 A | 3/1999 |
| JP | 2003342642 A | 12/2003 |
| JP | 2015086426 A | 5/2015 |
| JP | 2015147988 A | 8/2015 |
| JP | 2016145419 A | 8/2016 |
| JP | 2017122247 A | 7/2017 |
| TW | 200619394 A | 6/2006 |
| WO | 2017057513 A1 | 4/2017 |

OTHER PUBLICATIONS

International Search Report and Written Opinion for International Application No. PCT/JP2018/038133, dated Nov. 20, 2018, 5 pages.
Japanese Office Action for Japanese Application No. 2018-568983, dated Apr. 2, 2019, with Concise Statement of Relevance of Office Action, 4 pages.
Chinese Office Action with Search Report for Chinese Application No. 201880075675.9, dated Oct. 8, 2021, 11 pages.
European Communication pursuant to Article 94(3) for European Application No. 18 884 687.7, dated Dec. 17, 2021, 9 pages.
Extended European Search Report for European Application No. 18 884 687.7, dated Dec. 11, 2020, 9 pages.

* cited by examiner

[FIG. 1]
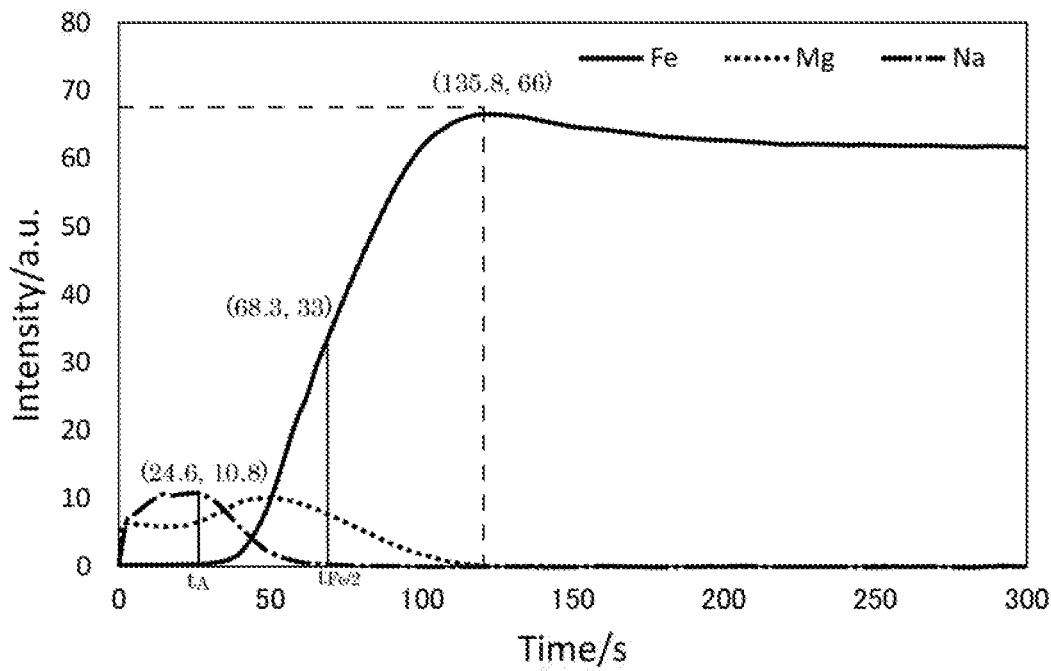
[FIG. 2]
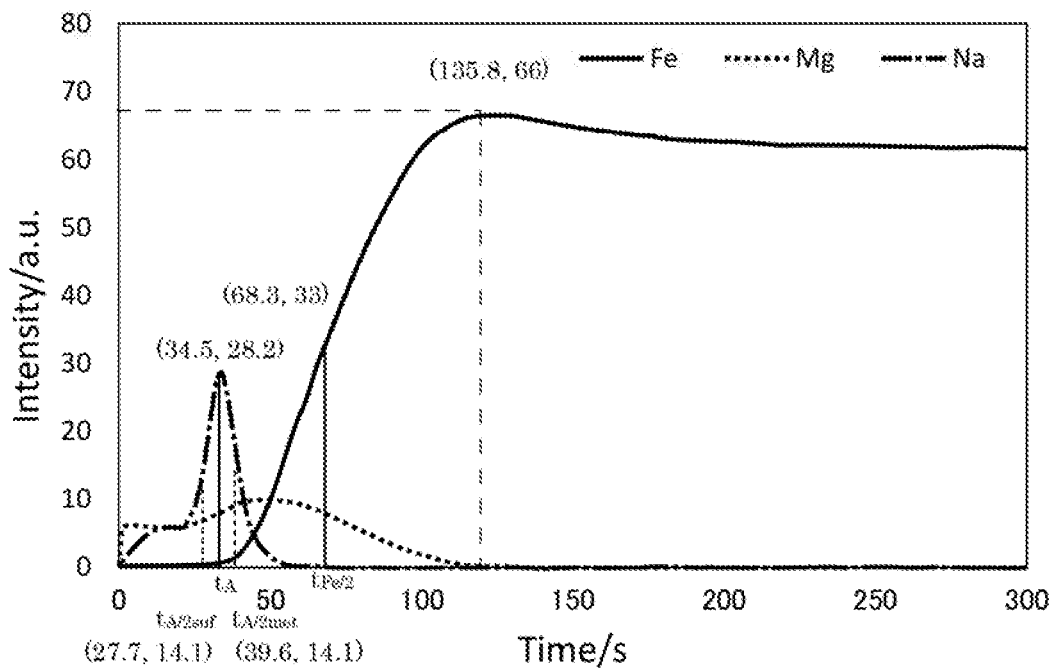

ORIENTED ELECTRICAL STEEL SHEET AND METHOD FOR PRODUCING SAME

CROSS REFERENCE TO RELATED APPLICATIONS

This is the U.S. National Phase application of PCT/JP2018/038133, filed Oct. 12, 2018, which claims priority to Japanese Patent Application No. 2017-228001, filed Nov. 28, 2017, the disclosures of these applications being incorporated herein by reference in their entireties for all purposes.

FIELD OF THE INVENTION

The present invention relates to a grain oriented electrical steel sheet and a method of manufacturing the same.

BACKGROUND OF THE INVENTION

Grain oriented electrical steel sheets are soft magnetic materials used as materials for iron cores of transformers, generators and the like. Grain oriented electrical steel sheets have a crystal structure in which the <001> orientation that is an easy magnetization axis of iron is highly-precisely aligned in the rolling direction of the steel sheet. The texture as above is formed through finishing annealing (secondary recrystallization annealing) of a manufacturing process of a grain oriented electrical steel sheet, which finishing annealing allows crystal grains with the {110}<001> orientation referred to as the so-called Goss orientation to preferentially grow to an enormous size.

In general, a grain oriented electrical steel sheet includes a forsterite coating and a silicophosphate glass coating in this order from the steel sheet-contacting side. The silicophosphate glass coating is provided for the purpose of imparting insulation quality, workability, and corrosion resistance to the grain oriented electrical steel sheet. In the meantime, glass has low adhesiveness to metal. Hence, the forsterite coating is usually formed between the steel sheet and the silicophosphate glass coating.

These coatings are formed at high temperature and have a lower coefficient of thermal expansion than that of the steel sheet, and a tension is therefore exerted to the steel sheet owing to a difference in a coefficient of thermal expansion between the steel sheet and each coating when the temperature drops to room temperature, whereby iron loss is reduced. In some cases, it is required to exert a high tension of, for example, 8 MPa or higher to the steel sheet (see claim 2 in Patent Literature 1).

In order to satisfy such requirement, coatings containing glassy substances have been conventionally proposed. For example, Patent Literature 2 proposes a coating formed using a coating liquid containing magnesium phosphate, colloidal silica and chromic anhydride. Patent Literature 3 proposes a coating formed using a coating liquid containing aluminum phosphate, colloidal silica and chromic anhydride.

In addition, as a technique to improve magnetic properties by forming a coating having a higher tension, for example, Patent Literature 4 proposes a technique of adjusting a glass transition temperature of colloidal silica.

PATENT LITERATURES

Patent Literature 1: JP 08-067913 A
Patent Literature 2: JP 50-079442 A
Patent Literature 3: JP 48-039338 A
Patent Literature 4: JP 11-071683 A

SUMMARY OF THE INVENTION

As described above, a coating in a grain oriented electrical steel sheet is required to exert a high tension to a steel sheet. Furthermore, good coating adhesion is also required.

The present inventors have studied a grain oriented electrical steel sheet including, on a steel sheet, a coating containing a crystalline substance (hereinbelow, also referred to as "coating A") and a coating containing a glassy substance (hereinbelow, also referred to as "coating B") in this order.

Specifically, the grain oriented electrical steel sheet as described above was subjected to working with a high strain rate such as shearing and slitting. As a result, a coating has sometimes peeled off at an end of the worked portion. In that case, it cannot be determined that the coating adhesion is good. When the peeling width of the coating at an end of a worked portion is large, there are concerns of generation of dust to harm a working environment and an occurrence of electrical conduction when the grain oriented electrical steel sheet is laminated.

Aspects of the present invention have been made in view of the above and aim at providing a grain oriented electrical steel sheet, in which a high tension is exerted to a steel sheet and the coating adhesion is excellent, as well as a method of manufacturing the same.

The present inventors have made an intensive study to achieve the foregoing objects.

First, the present inventors studied an end of each worked portion in detail and discovered that peeling of coating often occurs at an interface between the coating A and the coating B, which interface serves as a starting point. As a result of an intensive review based on the foregoing study, the present inventors found that by blending a large amount of an alkali metal element in the coating B, softening of the coating B during baking is promoted (that is, viscosity of the coating B is decreased), and wettability at the interface between the coating A and the coating B increases, whereby adhesion between the coating A and the coating B is improved.

Meanwhile, as Patent Literature 4 describes in the paragraph [0023] of the description, addition of an alkali metal element may lower the glass transition temperature of colloidal silica and may decrease a tension exerted to a steel sheet.

Accordingly, the present inventors conducted further study and found that a decrease in tension exerted to a steel sheet can be prevented by concentrating an alkali metal element in the interface between the coating A and the coating B. Aspects of the invention have been thus completed.

Specifically, aspects of the present invention provide the following [1] to [10].

[1] A grain oriented electrical steel sheet comprising a steel sheet, a coating A disposed on the steel sheet and containing a crystalline substance, and a coating B disposed on the coating A and containing a glassy substance, wherein element profiles acquired in a direction from the coating B toward the steel sheet using radio frequency glow discharge optical emission spectroscopy satisfy formulae (1) and (2) below, $$0.35 \geq (t_A/t_{Fe/2}) \geq 0.75 \quad (1)$$

$$0.25 \geq (t_{A/2}/t_{Fe/2}) \geq 1.00 \quad (2)$$

where $t_A$ represents a peak time in a profile of an alkali metal element, $t_{A/2}$ represents a half-value time in a profile of an alkali metal element, and $t_{Fe/2}$ represents a half-value time in a profile of Fe.

[2] The grain oriented electrical steel sheet according to [1], wherein the crystalline substance contained in the coating A is an oxide.

[3] The grain oriented electrical steel sheet according to [2], wherein the oxide is at least one type selected from the group consisting of forsterite and cordierite.

[4] The grain oriented electrical steel sheet according to [1], wherein the crystalline substance contained in the coating A is a nitride.

[5] The grain oriented electrical steel sheet according to [4], wherein the nitride is at least one type selected from the group consisting of titanium nitride, aluminum nitride and chromium nitride.

[6] The grain oriented electrical steel sheet according to any one of [1] to [5], wherein the glassy substance contained in the coating B is silicophosphate glass.

[7] The grain oriented electrical steel sheet according to [6], wherein the silicophosphate glass comprises at least one type of metal element selected from the group consisting of Mg, Al, Ca, Ti, Nd, Mo, Cr, B, Ta, Cu and Mn.

[8] The grain oriented electrical steel sheet according to any one of [1] to [7], wherein the alkali metal element is at least one type selected from the group consisting of Na and K.

[9] A method of manufacturing the grain oriented electrical steel sheet according to any one of [1] to [8], the method comprising:

a step of obtaining the steel sheet having the coating A, the coating A being disposed on the steel sheet; and a step of forming the coating B on the coating A of the steel sheet having the coating A, wherein, prior to formation of the coating B, the steel sheet having the coating A is immersed in an aqueous solution of an alkali metal compound, subsequently washed with water and dried, and wherein, in the steel sheet having the coating A after being dried, a coating amount of the alkali metal compound calculated in terms of alkali metal element on both sides is not less than $1.0 \times 10^{-5}$ mol/m$^2$.

[10] The method of manufacturing the grain oriented electrical steel sheet according to [9], wherein the coating amount is not more than $1.0 \times 10^{-2}$ mol/m$^2$.

Aspects of the present invention can provide a grain oriented electrical steel sheet, in which a high tension is exerted to a steel sheet and the coating adhesion is excellent, as well as a method of manufacturing the same.

BRIEF DESCRIPTION OF THE DRAWINGS

FIG. 1 is an example of element profiles measured in a grain oriented electrical steel sheet of a comparative example.

FIG. 2 is an example of element profiles measured in a grain oriented electrical steel sheet according to aspects of the present invention.

DETAILED DESCRIPTION OF EMBODIMENTS OF THE INVENTION

[Grain Oriented Electrical Steel Sheet and Manufacturing Method Thereof]

The grain oriented electrical steel sheet according to aspects of the invention is a grain oriented electrical steel sheet comprising a steel sheet, a coating A disposed on the steel sheet and containing a crystalline substance, and a coating B disposed on the coating A and containing a glassy substance, wherein element profiles acquired in a direction from the coating B toward the steel sheet using radio frequency glow discharge optical emission spectroscopy satisfy formulae (1) and (2) below, $$0.35 \geq (t_A/t_{Fe/2}) \geq 0.75 \tag{1}$$

$$0.25 \geq (t_{A/2}/t_{Fe/2}) \geq 1.00 \tag{2}$$

where $t_A$ represents a peak time in a profile of an alkali metal element, $t_{A/2}$ represents a half-value time in a profile of an alkali metal element, and $t_{Fe/2}$ represents a half-value time in a profile of Fe.

In the grain oriented electrical steel sheet according to aspects of the present invention, a high tension is exerted to the steel sheet, and the coating adhesion is excellent. The coating adhesion includes adhesion between the coating B and the coating A and adhesion between the coating A and the steel sheet.

The grain oriented electrical steel sheet according to aspects of the invention is described below in further detail. First, the element profile is described, and thereafter the respective structural parts (steel sheet, coating A and coating B) will be described. The following description also covers the manufacturing method of a grain oriented electrical steel sheet according to aspects of the invention.

<Element Profile>

An element profile acquired in a direction from the coating B toward the steel sheet (also referred to as "sheet-thickness direction") is obtained through the radio-frequency glow discharge optical emission spectroscopy (rf-GD-OES).

More specifically, the measurement is carried out using the Marcus-type radio-frequency glow discharge optical emission spectroscopic analyzer, "GD-Profiler 2" manufactured by HORIBA, Ltd. with plasma gas of Ar 100% under conditions of gas pressure: 600 Pa, radio-frequency output: 35 W and measurement interval: 0.1 second/dot.

In a graph of element profiles, a horizontal axis shows a sputtering time (measurement time), while a vertical axis shows an emission intensity (intensity value) of each element. See FIGS. 1 and 2, for instance.

FIG. 1 is an example of element profiles measured in a grain oriented electrical steel sheet of a comparative example. FIG. 2 is an example of element profiles measured in a grain oriented electrical steel sheet according to aspects of the present invention. FIGS. 1 and 2 are each a graph showing profiles of Fe, Mg and Na.

For measurements of the element profiles of FIGS. 1 and 2, samples of the grain oriented electrical steel sheet were prepared as described below.

A grain oriented electrical steel sheet having undergone finishing annealing and having a sheet thickness of 0.23 mm manufactured by a known method was sheared to a size of 300 mm (rolling direction)×100 mm (in direction perpendicular to rolling direction), and an unreacted annealing separator was removed therefrom. Subsequently, stress relief annealing was performed under conditions of 800° C., 2 hours and N$_2$ atmosphere. The coating A containing forsterite as a crystalline substance was formed on a surface of the steel sheet.

Next, the sheet was slightly pickled in 5 mass % aqueous phosphoric acid solution. Following the slight pickling, the resulting sheet was subjected to no additional treatment in the comparative example of FIG. 1. In accordance with aspects of the present invention of FIG. 2, on the other hand, the resulting sheet was immersed in a 10 mass % NaOH aqueous solution at 25° C. for 5 seconds and was then washed with water, to thereby obtain a coating amount (on both sides) of 0.01 g/m² in the form of NaOH.

Thereafter, a magnesium phosphate aqueous solution (100 parts by mass calculated in terms of solid content), colloidal silica (50 parts by mass calculated in terms of solid content) and $CrO_3$ (15 parts by mass) were mixed, and the resulting aqueous solution was diluted with pure water to be adjusted to have a specific gravity of 1.20 g/cc. A coating liquid was thus obtained. The obtained coating liquid was applied to both sides of the steel sheet having the coating A with a roll coater such that an amount of coating on the both sides after being dried becomes 10 g/m².

The steel sheet having the coating A over which the coating liquid was applied was placed in a drying furnace and dried at 300° C. for 1 minute, followed by baking under conditions of 800° C. for 2 minutes and 100% of $N_2$. As a result of baking, the coating B containing silicophosphate glass as a glassy substance was formed on the coating A.

Samples of the grain oriented electrical steel sheet (coating B/coating A/steel sheet) were obtained in this manner.

<<Half-Value Time $t_{Fe/2}$ in Fe Profile>>

A half-value time $t_{Fe/2}$ in a profile of Fe is determined to be a time when the value of the intensity (of the surface side) becomes a half of the peak intensity of the profile, in case where the profile of Fe has a peak.

In case where the profile of Fe has no peak, the half-value time is determined as follows. The sputtering is performed for a long period of time until the sputter depth sufficiently reaches the steel sheet (base iron) and the value of Fe emission intensity becomes constant. The half-value time $t_{Fe/2}$ in the profile of Fe is then determined to be a time when the value of the intensity of the outermost surface side (coating B side) becomes a half of the constant value of the Fe emission intensity (intensity value).

<<Peak Time $t_A$ in Profile of Alkali Metal Element>>

A peak time $t_A$ in a profile of an alkali metal element (also expressed as "A" below) is determined to be the peak time, in case where the profile has a single peak only, and the highest peak time, in case where the profile has plural peaks.

<<Half-Value Time $t_{A/2}$ in Profile of Alkali Metal Element>>

A half-value time $t_{A/2}$ in a profile of an alkali metal element is determined to be a time when the value of the intensity becomes a half of the value of the peak intensity (in case where the profile has a single peak only; alternatively, a half of the value of the highest peak intensity in case where the profile has plural peaks). In addition, the half-value time of the surface side (coating B side) is expressed as $t_{A/2sur}$, and the half-value time of the steel sheet side as $t_{A/2met}$. It should be noted that "$t_{A/2}$" conceptually encompasses both "$t_{A/2sur}$" and "$t_{A/2met}$."

<<Formula (1): $0.35 \geq (t_A/t_{Fe/2}) \geq 0.75$>>

The formula (1): $0.35 \geq (t_A/t_{Fe/2}) \geq 0.75$ is to be described.

When $t_A/t_{Fe/2}$ is less than 0.35, the alkali metal element is not concentrated in an interface between the coating A and the coating B but predominantly contained in the coating B, and the tension exerted to the steel sheet is therefore insufficient.

When $t_A/t_{Fe/2}$ is larger than 0.75, the alkali metal element is infiltrated in the coating A to be concentrated in the crystal interfaces to lower the grain boundary strength, and the adhesion between the coating A and the steel sheet becomes inferior.

Meanwhile, when $t_A/t_{Fe/2}$ is 0.35 or more and 0.75 or less, the alkali metal element is concentrated in the interface between the coating A and the coating B. At this time, the interface between the coating A and the coating B has good wettability, and the adhesion between the coating A and the coating B is excellent. In addition, since a state where only the coating B contains a large amount of alkali metal element is prevented, the tension exerted to the steel sheet is excellent. Furthermore, since a state where the coating A is infiltrated with the alkali metal element is prevented, the adhesion between the coating A and the the steel sheet is excellent.

It is preferable that $t_A/t_{Fe/2}$ is 0.40 or more and 0.75 or less.

<<Formula (2): $0.25 \geq (t_{A/2}/t_{Fe/2}) \geq 1.00$>>

The formula (2): $0.25 \geq (t_{A/2}/t_{Fe/2}) \geq 1.00$ is to be described.

As described above, $t_{A/2}$ conceptually encompasses both $t_{A/2sur}$ and $t_{A/2met}$. Both $t_{A/2sur}/t_{Fe/2}$ and $t_{A/2met}/t_{Fe/2}$ are required to meet 0.25 or more and 1.00 or less.

When $t_{A/2sur}/t_{Fe/2}$ is less than 0.25 (i.e., when the alkali metal element has a broad profile), it cannot be construed as the alkali metal element being concentrated in the interface between the coating A and the coating B; rather, the alkali metal element is predominantly contained in the coating B only. Accordingly, while the effect of improving the adhesion is attained, the tension exerted to the steel sheet is insufficient.

When $t_{A/2met}/t_{Fe/2}$ is more than 1.00, an amount of the alkali metal element infiltrated into the coating A is large, the alkali metal element is concentrated in crystal interfaces to lower the grain boundary strength, and the adhesion between the coating A and the steel sheet is inferior.

Meanwhile, when $t_{A/2}/t_{Fe/2}$ (i.e., both of $t_{A/2sur}/t_{Fe/2}$ and $t_{A/2met}/t_{Fe/2}$) is 0.25 or more and 1.00 or less, the alkali metal element is concentrated in the interface between the coating A and the coating B as with the case of Formula (1). At this time, the interface between the coating A and the coating B has good wettability, and the adhesion between the coating A and the coating B is excellent. In addition, since a state where only the coating B contains a large amount of alkali metal element is prevented, the tension exerted to the steel sheet is excellent. Furthermore, since a state where the coating A is infiltrated with the alkali metal element is prevented, the adhesion between the coating A and the steel sheet is excellent.

It is preferable that $t_{A/2}/t_{Fe/2}$ is 0.30 or more and 0.90 or less.

<<Type of Alkali Metal Element>>

Examples of alkali metal element (that is, alkali metal element to be concentrated in the interface between the coating A and the coating B) include Li, Na, K, Rb, Cs and Fr.

Among these, it is preferable to select at least one type from the group consisting of Li, Na and K because these elements are priced more advantageously and excellent in availability as compared to Rb, Cs and Fr, and it is preferable to select at least one type from the group consisting of Na and K because these elements exert the higher tension to the steel sheet as compared to Li.

A method for adjusting a profile of an alkali metal element will be described later.

The respective structural parts (steel sheet, coating A and coating B) of the grain oriented electrical steel sheet according to aspects of the invention will be next described.

<Steel Sheet>

While the steel sheet is not particularly limited, a steel slab that forms the steel sheet preferably comprises, for example, as components in steel, in percentage by mass, C in an amount from 0.001% to 0.10%, Si in an amount from 1.0% to 5.0%, Mn in an amount from 0.01% to 1.0%, sol. Al in an amount from 0.003% to 0.050%, N in an amount from 0.001% to 0.020%, S in an amount from 0.001% to 0.05%, and/or Se in an amount from 0.001% to 0.05% with the balance being inevitable impurities and Fe for the sake of the magnetic properties.

C is a component useful in generating crystal grains in the Goss orientation, and in order for the component to effectively exhibit such function, a C content is preferably not less than 0.001 mass %. Meanwhile, when the C content is too high, decarburization may fail even if the steel slab is subjected to decarburization annealing. Hence, the C content is preferably not more than 0.10 mass %.

Si is a component that raises the electrical resistance and decreases the iron loss, and is also necessary for stabilizing the BCC structure of iron and enabling heat treatment at high temperature. A Si content is preferably not less than 1.0 mass % and more preferably not less than 2.0 mass %. Meanwhile, when the Si content is too high, it is sometimes difficult to perform cold rolling. Hence, the Si content is preferably not more than 5.0 mass %.

Mn not only effectively contributes to the improvement in thermal brittleness of steel but also generates precipitates of MnS or MnSe, for example, when S or Se is blended, and therefore Mn acts as an inhibitor. In order to sufficiently obtain this effect, a Mn content is preferably not less than 0.01 mass %. Meanwhile, when the Mn content is too high, the grains of precipitates such as MnSe may be coarsened so that the effect of acting as an inhibitor may be lost. Hence, the Mn content is preferably not more than 1.0 mass %.

Al is a useful component that forms AlN as the dispersed second phase in steel and exhibits an action as an inhibitor. When an Al content is too low, a sufficient amount of precipitates may not be ensured in some cases. Meanwhile, when the Al content is too high, AlN precipitates may be coarsened so that the effect of acting as an inhibitor may be lost. Hence, the sol. Al content is preferably 0.003 mass % to 0.050 mass %.

As with Al, N is a component used for generating AlN. When a N content is too low, precipitation of AlN may be insufficient. Meanwhile, when the N content is too high, the slab may have blisters or the like when being heated. Hence, the Ni content is preferably 0.001 mass % to 0.020 mass %.

S and Se are useful components that bond to Mn or Cu to form, for example, MnSe, MnS, $Cu_{2-x}Se$ or $Cu_{2-x}S$ and exhibit an action as an inhibitor of the dispersed second phase in steel. When a S content and/or a Se content is too low, the addition thereof may have a poor effect, whereas when the content is too high, the slab may experience imperfect solid solubilization when being heated, causing a defect on a product surface. Hence, the S content and/or the Se content is preferably 0.001 mass % to 0.05 mass %.

The steel slab that forms the steel sheet can further comprise at least one element selected from the group consisting of, in percentage by mass, Cu in an amount from 0.01% to 0.2%, Ni in an amount of 0.01% to 0.5%, Cr in an amount of 0.01% to 0.5%, Sb in an amount of 0.01% to 0.1%, Sn in an amount of 0.01% to 0.5%, Mo in an amount of 0.01% to 0.5%, and Bi in an amount of 0.001% to 0.1%. By adding an element that acts as a supplemental inhibitor, the magnetic properties can be further improved. Examples of such element include the elements listed above. Any of the elements may hardly exhibit the effect when the element content is short of the above amounts. Meanwhile, when the element content exceeds the above amounts, the coating may have inferior appearance or may have a secondary recrystallization failure. Hence, the element content preferably falls under the ranges as above.

In addition to the above-listed components, the steel slab that forms the steel sheet can further comprise at least one element selected from the group consisting of, in percentage by mass, B in an amount from 0.001% to 0.01%, Ge in an amount from 0.001% to 0.1%, As in an amount from 0.005% to 0.1%, P in an amount from 0.005% to 0.1%, Te in an amount from 0.005% to 0.1%, Nb in an amount from 0.005% to 0.1%, Ti in an amount from 0.005% to 0.1%, and V in an amount from 0.005% to 0.1%. Such addition enhances the inhibitory action, thereby stably achieving the higher magnetic flux density.

For instance, the steel sheet is manufactured as described below.

The above-described steel slab is subjected to hot rolling to thereby obtain a hot rolled steel sheet. The hot rolled steel sheet is subjected to hot band annealing, as necessary, and thereafter is subjected to cold rolling once or twice or more times with intermediate annealing performed therebetween, to thereby obtain a cold rolled steel sheet with a final sheet thickness. The cold rolled steel sheet is subjected to a primary recrystallization annealing and decarburization annealing (typically, a primary recrystallization annealing doubles as the decarburization annealing), and is then subjected to a finishing annealing, following application of an annealing separator. The steel sheet in which crystal grains (secondary recrystallized grains) in Goss orientation have developed (grain oriented electrical steel sheet) is obtained in this manner. The manufacturing conditions can adopt conventionally known conditions and are not particularly limited.

For instance, when an annealing separator comprising MgO as a main component is used, a coating containing forsterite (forsterite coating) is formed on a surface of the resulting steel sheet.

For instance, when an annealing separator comprising $Al_2O_3$ as a main component is used, a coating containing cordierite (cordierite coating) would be formed on a surface of the resulting steel sheet.

The forsterite coating and the cordierite coating each correspond to the coating A to be described later.

If either one of these coatings is utilized as the coating A, the coating B to be described later would be directly formed.

If neither of these coatings is utilized as the coating A, the unutilized coating A would be removed through pickling or the like, followed by formation of a different coating A (coating A containing a nitride to be described later, for example), and thereafter the coating B to be described later would be formed.

The grain oriented electrical steel sheet (steel sheet) may be manufactured without forming these coatings.

<Coating A>

The coating A is a coating disposed on the steel sheet and containing a crystalline substance. The method of manufacturing the coating A is not particularly limited, and examples thereof include, in addition to the foregoing method, the Chemical Vapor Deposition (CVD) method, the Physical Vapor Deposition (PVD) method, the Sol-gel process and the steel sheet-oxidation method.

The crystalline substance contained in the coating A is exemplified by an oxide, and a preferable example thereof may be at least one selected from the group consisting of forsterite and cordierite. The coating A containing forsterite as the crystalline oxide is the forsterite coating as described above. The coating A containing cordierite as the crystalline oxide is the cordierite coating as described above. The methods of manufacturing these coatings have been already discussed.

The crystalline substance contained in the coating A may be a nitride. The nitride may be exemplified by a metal nitride. A preferable example of metal nitride is a metal nitride containing at least one type of metal selected from the group consisting of Ti, Al and Cr, and a more preferable example thereof is selected from the group consisting of titanium nitride (TiN), aluminum nitride (AlN) and chromium nitride (CrN).

The coating A containing a nitride is formed by, for example, the CVD method or the PVD method.

The crystalline substance content of the coating A is preferably not less than 80 mass %, more preferably not less than 90 mass % and even more preferably 100 mass %.

The crystalline substance content of the coating A can be measured by the X-ray diffraction using a calibration curve.

The coating A may be consisted of two or more layers.

The thickness of the coating A on one side (total thickness of the respective layers in case of two or more layers) is not particularly limited and is preferably 0.05 µm to 5.00 µm and more preferably 0.10 µm to 3.00 µm.

<Coating B>

The coating B is a coating disposed on the coating A and containing a glassy substance and is so-called an insulation tension coating.

The glassy substance contained in the coating B is exemplified by silicophosphate glass, and a preferable example thereof is a silicophosphate glass containing at least one type of metal element selected from the group consisting of Mg, Al, Ca, Ti, Nd, Mo, Cr, B, Ta, Cu and Mn. From the viewpoint of the recent environmental regulations, it is preferable not to contain Cr.

The coating B may contain a crystalline substance (excluding the crystalline substance contained in the coating A). The balance other than the glassy substance is a crystalline substance.

The glassy substance content of the coating B is preferably 10 mass % to 100 mass %, since when the content is less than 10 mass %, the coating adhesion between the coating A and the coating B may be inferior.

In addition, by including a crystalline substance in the glassy substance to form a crystallized glass, the coating B can obtain properties that cannot be achieved by the glassy substance alone (such as low thermal expansion and high heat resistance). The glassy substance content of the coating B is preferably 30 mass % to 90 mass % and more preferably 40 mass % to 70 mass % ore more.

When the coating B is formed by the method B1 or the method B2 described below, the glassy substance content of the formed coating B can be regarded as being not less than 10 mass %.

The method of forming the coating B is not particularly limited, and an example thereof is a method of obtaining the coating B by applying a coating liquid over the coating A, followed by baking (method B1). The baking process may be flattening annealing that doubles as baking.

The coating liquid preferably contains phosphoric acid and/or phosphate, and colloidal silica. Exemplary metal species of the phosphate include Mg, Al, Ca, Mn and Ni.

The coating liquid can further contain a metal compound. An exemplary metal species of the metal compound is at least one selected from the group consisting of Mg, Al, Ca, Ti, Nd, Mo, Cr, B, Ta, Cu and Mn. Boron (B) is treated as metal.

The amounts of respective components in the coating liquid are not particularly limited and can be suitably set.

When the coating liquid is used, a baking temperature is 600° C. to 1,000° C., for instance. A baking time is 1 second to 300 seconds, for instance. An atmosphere for baking is a nitrogen atmosphere, for instance.

The method of forming the coating B may be a method of obtaining the coating B by applying a glass frit over the coating A, followed by baking (method B2).

For example, the glass frit contains, as an oxide, PbO, $SiO_2$, $B_2O_3$, BaO or ZnO.

When the glass frit is used, a baking temperature is 600° C. to 1,200° C., for instance. A baking time is 5 minutes to 20 minutes, for instance. An atmosphere for baking is a nitrogen atmosphere, for instance.

The coating B may be consisted of two or more layers.

The thickness of the coating B on one side (total thickness of the respective layers in case of two or more layers) is preferably 1.0 µm to 6.0 µm and more preferably 1.5 µm to 4.0 µm in order to attain good interlaminar insulation resistance and lamination factor.

The tension exerted to the steel sheet by the coating B is preferably not less than 8 MPa, more preferably not less than 10 MPa and even more preferably not less than 12 MPa, for instance. By increasing the tension exerted to the steel sheet, the iron loss can be lowered and noise when used in a transformer can be reduced.

<Method for Adjusting Profile of Alkali Metal Element>

The method of manufacturing the grain oriented electrical steel sheet according to aspects of the invention is, in general, a method comprising a step of obtaining a steel sheet having the coating A and a step of forming the coating B on the steel sheet having the coating A.

Here, in order to satisfy the foregoing formulae (1) and (2), the method for adjusting a profile of an alkali metal element may be exemplified by, but not limited to, the methods 1 to 3 described below.

<<Method 1>>

The method 1 is a method, in which the steel sheet having the coating A is immersed in an aqueous solution of an alkali metal compound and thereafter washed with water and dried, prior to formation of the coating B. At this time, a profile of the alkali metal element is adjusted by adjusting conditions of water washing including a water-washing time.

The alkali metal element is not particularly limited, and examples thereof include LiOH, NaOH, KOH, $Li_2SO_4$, $Na_2SO_4$, $K_2SO_4$, LiCl, NaCl, $Na_2HPO_4$ and $K_2HPO_4$.

In the method 1, the alkali metal compound content of the aqueous solution in which the steel sheet having the coating A is immersed is preferably not less than 1 mass % and more preferably not less than 5 mass % because the coating amount to be described later is likely to be attained. Meanwhile, the content is preferably not more than 40 mass % and more preferably not more than 30 mass % because an amount of alkali metal compound to be removed by water washing can be small, being economically advantageous.

In the method 1, the temperature of the aqueous solution of alkali metal compound in which the steel sheet having the coating A is immersed is preferably not lower than 10° C. and more preferably not lower than 15° C. because the coating amount to be described later is likely to be attained. Meanwhile, the temperature is preferably not higher than 80° C. and more preferably not higher than 70° C. because an anion such as $OH^-$, $SO_4^{2-}$ and $Cl^-$ of the alkali metal compound hardly corrodes the coating A and the steel sheet.

In the method 1, a time for immersing the steel sheet having the coating A in the aqueous solution of alkali metal compound (immersion time) is not particularly limited and is preferably 1 second to 60 seconds and more preferably 5 seconds to 30 seconds, for instance.

A coating amount of the alkali metal compound calculated in terms of alkali metal element on both sides of the steel sheet having the coating A after being dried is not less than $1.0 \times 10^{-6}$ mol/m$^2$, for instance, and is preferably not less than $1.0 \times 10^{-5}$ mol/m$^2$ because the coating adhesion becomes more excellent.

The upper limit of the coating amount is not particularly limited, and an example thereof is not more than $1.0 \times 10^{-2}$ mol/m$^2$.

The coating amount of the alkali metal compound in terms of alkali metal element can be found from a mass variation of the steel sheet having the coating A before and after the treatment (immersion in the aqueous solution of alkali metal compound, water washing and drying). In addition, by preliminarily preparing a plurality of steel sheets having the coating A with varied coating amounts of alkali metal element as standard sheets and preparing calibration curves based on fluorescent X-ray count numbers of alkali metal element, the coating amount of the alkali metal compound in terms of alkali metal element as above can be readily measured using fluorescent X-ray.

In the method 1, following the drying, the coating liquid is applied over the coating A and baked, whereby the coating B is formed. At this time, distribution of the alkali metal element can be adjusted by changing and adjusting a baking time and other conditions of baking the coating B to regulate dispersion of the alkali metal element.

<<Method 2>>

The method 2 is a method, in which application of the coating liquid and baking are repeated multiple times to form the coating B consisted of multiple layers on the coating A. The colloidal silica used in the coating liquid may contain an alkali metal element such as Na in some cases. In the method 2, for example, an amount of alkali metal element in the colloidal silica used for the coating B is set to be larger in the first layer of the coating B than in the second layer. In this manner, a profile of alkali metal element is adjusted such that the foregoing formulae (1) and (2) are satisfied.

<<Method 3>>

The method 3 is a method, in which application of a glass frit and baking are repeated multiple times to form the coating B consisted of multiple layers on the coating A. In the method 3, KOH, NaOH or another alkali metal compound is blended in the glass frit that is used for the first layer of the coating B. In this manner, a profile of alkali metal element is adjusted such that the foregoing formulae (1) and (2) are satisfied.

EXAMPLES

Aspects of the present invention are specifically described below with reference to examples. However, the present invention should not be construed as being limited to the following examples.

Test Example 1

<Production of Grain Oriented Electrical Steel Sheet>

Each specimen of grain oriented electrical steel sheet comprising the coating A and the coating B in this order on the steel sheet was produced as explained below.

First, prepared was a silicon steel slab containing, in percentage by mass, Si in an amount of 3.3%, C in an amount of 0.06%, Mn in an amount of 0.08%, S in an amount of 0.001%, Al in an amount of 0.015%, N in an amount of 0.006%, Cu in an amount of 0.05% and Sb in an amount of 0.01%.

The silicon steel slab was heated at 1,100° C. for 30 minutes and thereafter subjected to hot rolling, whereby a hot rolled steel sheet with a thickness of 2.2 mm was obtained. The obtained hot rolled steel sheet was subjected to annealing at 1,000° C. for 1 minute and thereafter subjected to cold rolling, whereby a cold rolled steel sheet coil with a final thickness of 0.27 mm was obtained. A cold rolled steel sheet specimen of 100 mm (direction perpendicular to rolling direction)×400 mm (rolling direction) in size was sampled from the center part of the cold rolled steel sheet coil thus obtained. In a laboratory, the sampled specimen of cold rolled steel sheet was exposed to an elevated temperature from room temperature to 820° C. at a heating rate of 20° C./s and was subjected to the primary recrystallization annealing in a wet atmosphere at 820° C. for 60 seconds. Subsequently, an annealing separator obtained by mixing 100 parts by mass of MgO with 10 parts by mass of TiO$_2$ was made into a water slurry form and applied to the surface of the cold rolled steel sheet specimen having been subjected to the primary recrystallization annealing. The specimen was then dried. The cold rolled steel sheet specimen after being dried was exposed to an elevated temperature from 300° C. to 800° C. in 100 hours and thereafter elevated to 1,200° C. at a heating rate of 50° C./hr, and was subjected to the finishing annealing at 1,200° C. for 5 hours. In this manner, the coating A containing forsterite as the crystalline substance (forsterite coating) was formed, and the steel sheet having the coating A was obtained. The thickness of the coating A (forsterite coating) was 1.2 μm. The crystalline substance content of the coating A was not less than 80 mass %.

The obtained steel sheet having the coating A was immersed in an aqueous solution containing 5 mass % of the alkali metal compound shown in Table 1 below at 25° C. for 10 seconds. Subsequently, the steel sheet having the coating A was washed with pure water and dried. In this process, by adjusting the level of water washing, the coating amount of the alkali metal compound calculated in terms of alkali metal element (on both sides) after being dried was adjusted. The coating amount was measured by the method as described above.

Next, prepared was a silicophosphate-based insulation tension coating liquid containing magnesium phosphate (30 mol % in terms of Mg(P$_3$)$_2$), colloidal silica (60 mol % in terms of SiO$_2$) and CrO$_3$ (10 mol %). The prepared coating liquid was applied over the coating A and baked at 850° C. In this manner, the coating B containing silicophosphate glass as the glassy substance was formed on the coating A.

At this time, the baking time (unit: s (second)) shown in Table 1 was adopted.

For colloidal silica, an acidic-type colloidal silica containing a small amount of Na, "SNOWTEX-O" manufactured by Nissan Chemical Industries, Ltd. (Na content: 0.03 mass %) was used.

The coating liquid was applied in an amount of 10 g/m$^2$ on both sides.

The thickness of the coating B was 2.5 μm on each side.

<Measurement of Element Profile>

Of the thus prepared specimen of grain oriented electrical steel sheet, the element profiles were acquired in the thickness direction using "GD-Profiler 2" manufactured by HORIBA, Ltd. under the foregoing conditions. From the measurement results, the half-value time $t_{Fe/2}$ in a profile of Fe as well as the peak time $t_A$ and the half-value time $t_{A/2}$ ($t_{A/2sur}$, $t_{A/2met}$) in a profile of alkali metal element (A:Li, Na, K) were determined. In addition, $t_A/t_{Fe/2}$, $t_{A/2sur}/t_{Fe/2}$ and $t_{A/2met}/t_{Fe/2}$ were found. The results are shown in Table 1 below.

<Evaluation>

The prepared specimens of grain oriented electrical steel sheet were evaluated as described below. The results are shown in Table 1 below.

<<Peeling Width of Coating>>

The specimen of the grain oriented electrical steel sheet thus prepared was subjected to shearing work in the thickness direction using a shearing machine. Thereafter, an end of the worked portion was observed using a metallographic microscope, a distance of peeling at the end of worked portion (distance from the worked end surface) of the coating (at least one of the coating A and the coating B) was measured, and the measured distance was regarded as a peeling width (unit: mm) at the end of the worked portion of the coating.

The smaller peeling width of coating can be evaluated as having excellent coating adhesion, and the peeling width of coating is preferably less than 3.0 mm for practical use.

<<Bend and Stripping Diameter>>

The specimen of the grain oriented electrical steel sheet thus prepared was subjected to stress relief annealing in a nitrogen atmosphere at 800° C. for 3 hours. Subsequently, the specimen was wound around round bars having diameters different on a 10-millimeter basis, to determine the minimum diameter (bend and stripping diameter) among diameters with which the coating (at least one of the coating A and the coating B) did not peel off or experience crack occurrence. The smaller bend and stripping diameter (unit: mm) can be evaluated as having excellent coating adhesion, and the bend and stripping diameter is preferably less than 40 mm for practical use.

<<Exerted Tension>>

First, a corrosion protection tape was attached onto one side (entire surface) of the produced specimen of grain oriented electrical steel sheet. Subsequently, the specimen having the corrosion protection tape attached thereon was immersed in an aqueous solution containing 25 mass % of NaOH at 110° C. for about 10 minutes to thereby remove the coating B on the side having no corrosion protection tape attached thereon. As a result of removal of the coating B on one side, warpage of the specimen occurred. The corrosion protection tape was removed, and the radius of curvature of the specimen was measured. From the measured radius of curvature, an exerted tension (unit: MPa) exerted by the coating B to the steel sheet was determined.

The exerted tension is preferably not less than 8.0 MPa.

TABLE 1

| No. | Alkali metal compound Type | Coating B Coating weight (both/sides) [mol/m²] | Baking time [s] | $t_A$ [s] | $t_{A/2sur}$ [s] | $t_{A/2met}$ [s] | $t_{Fe/2}$ [s] | $t_A/t_{Fe/2}$ | $t_{A/2sur}/t_{Fe/2}$ | $t_{A/2met}/t_{Fe/2}$ | Peeling width of coating [mm] | Bend and stripping diameter [mm] | Exerted tension [MPa] | Remarks |
|---|---|---|---|---|---|---|---|---|---|---|---|---|---|---|
| 1 | — | — | 20 | — | — | — | 69.9 | — | — | — | 3.0 | 30 | 13.5 | PE |
| 2 | LiOH | 1.0 × 10⁻⁴ | 3 | 52.0 | 44.0 | 56.0 | 68.1 | 0.76 | 0.65 | 0.82 | 3.2 | 40 | 10.1 | CE |
| 3 | LiOH | 2.0 × 10⁻³ | 15 | 32.5 | 27.8 | 34.1 | 70.7 | 0.46 | 0.39 | 0.48 | 0.3 | 20 | 12.8 | EX |
| 4 | NaOH | 1.0 × 10⁻⁶ | 15 | 33.6 | 21.1 | 36.0 | 72.8 | 0.46 | 0.29 | 0.50 | 2.5 | 30 | 11.8 | EX |
| 5 | NaOH | 1.0 × 10⁻⁵ | 15 | 33.8 | 29.1 | 40.9 | 71.2 | 0.48 | 0.41 | 0.57 | 0.9 | 30 | 14.2 | EX |
| 6 | NaOH | 3.0 × 10⁻³ | 2 | 42.6 | 40.2 | 45.7 | 72.2 | 0.59 | 0.56 | 0.63 | 0.3 | 30 | 13.5 | EX |
| 7 | NaOH | 3.0 × 10⁻³ | 20 | 30.9 | 27.6 | 35.1 | 73.2 | 0.42 | 0.38 | 0.48 | 0.4 | 30 | 13.0 | EX |
| 8 | NaOH | 3.0 × 10⁻³ | 60 | 29.4 | 24.2 | 34.6 | 74.2 | 0.40 | 0.33 | 0.47 | 0.4 | 30 | 12.9 | EX |
| 9 | NaOH | 3.0 × 10⁻³ | 90 | 26.0 | 24.3 | 38.6 | 75.2 | 0.35 | 0.32 | 0.51 | 0.8 | 30 | 11.2 | EX |
| 10 | NaOH | 3.0 × 10⁻³ | 180 | 24.8 | 5.6 | 43.6 | 76.2 | 0.33 | 0.07 | 0.57 | 2.5 | 30 | 6.2 | CE |
| 11 | NaOH | 1.0 × 10⁻² | 20 | 33.7 | 29.6 | 38.2 | 70.2 | 0.48 | 0.42 | 0.54 | 0.2 | 30 | 12.6 | EX |
| 12 | NaOH | 2.0 × 10⁻¹ | 20 | 50.0 | 29.0 | 72.0 | 70.9 | 0.70 | 0.41 | 1.01 | 3.1 | 40 | 10.2 | CE |
| 13 | KOH | 2.6 × 10⁻⁴ | 15 | 33.9 | 28.4 | 34.9 | 70.2 | 0.48 | 0.41 | 0.50 | 1.0 | 30 | 14.1 | EX |
| 14 | KOH | 2.6 × 10⁻⁴ | 120 | 32.9 | 15.4 | 48.0 | 74.2 | 0.44 | 0.21 | 0.65 | 0.8 | 30 | 6.4 | CE |
| 15 | KOH | 5.4 × 10⁻³ | 30 | 34.8 | 17.7 | 51.9 | 72.1 | 0.48 | 0.25 | 0.72 | 0.6 | 30 | 11.6 | EX |
| 16 | KOH | 4.8 × 10⁻² | 30 | 32.3 | 22.4 | 41.3 | 70.3 | 0.46 | 0.32 | 0.59 | 0.4 | 30 | 12.6 | EX |
| 17 | Li₂SO₄ | 3.6 × 10⁻³ | 20 | 33.8 | 16.1 | 46.9 | 70.5 | 0.48 | 0.23 | 0.67 | 0.6 | 30 | 7.8 | CE |
| 18 | Na₂SO₄ | 7.5 × 10⁻⁵ | 20 | 35.0 | 31.7 | 39.1 | 74.1 | 0.47 | 0.43 | 0.53 | 0.9 | 30 | 14.3 | EX |
| 19 | Na₂SO₄ | 4.5 × 10⁻⁴ | 20 | 35.0 | 28.7 | 44.6 | 74.1 | 0.47 | 0.39 | 0.60 | 0.8 | 30 | 14.5 | EX |
| 20 | K₂SO₄ | 6.8 × 10⁻² | 20 | 33.8 | 22.9 | 50.8 | 72.5 | 0.47 | 0.32 | 0.70 | 0.3 | 30 | 12.5 | EX |
| 21 | LiCl | 8.4 × 10⁻⁶ | 20 | 32.4 | 25.2 | 48.6 | 73.9 | 0.44 | 0.34 | 0.66 | 1.8 | 30 | 12.1 | EX |
| 22 | NaCl | 1.0 × 10⁻⁴ | 20 | 32.4 | 32.3 | 37.5 | 68.7 | 0.47 | 0.47 | 0.55 | 0.6 | 30 | 14.2 | EX |
| 23 | Na₂HPO₄ | 9.4 × 10⁻⁵ | 20 | 32.7 | 15.5 | 44.4 | 69.4 | 0.47 | 0.22 | 0.64 | 0.6 | 30 | 7.9 | CE |
| 24 | K₂HPO₄ | 2.2 × 10⁻⁴ | 20 | 32.8 | 18.8 | 43.5 | 72.0 | 0.46 | 0.26 | 0.60 | 0.4 | 30 | 10.6 | EX |
| 25 | K₂HPO₄ | 1.6 × 10⁻³ | 15 | 32.2 | 30.0 | 35.1 | 75.2 | 0.43 | 0.40 | 0.47 | 0.2 | 30 | 13.8 | EX |

PE = Prior art Example
CE = Comparative Example
EX = Example

Table 1 above revealed that, when $0.35 \geq (t_A/t_{Fe/2}) \geq 0.75$ and $0.25 \geq (t_{A/2}t_{Fe/2}) \geq 1.00$ were satisfied, the peeling width of coating and the bend and stripping diameter were so small that the coating adhesion was excellent, and, in addition, the exerted tension to the steel sheet was high.

Moreover, it was revealed that, when the coating amount (on both sides) of alkali metal compound in terms of alkali metal element was not less than $1.0 \times 10^{-5}$ mol/m², the peeling width of coating was suppressed to be not more than 1.0 mm, and hence the coating adhesion was more excellent.

On the other hand, the peeling width of coating and the bend and stripping diameter were large in No. 2 where $(t_A/t_{Fe/2}) \geq 0.75$ was not satisfied, and the coating adhesion was inferior.

In No. 10 where $0.35 \geq (t_A/t_{Fe/2})$ and $0.25 \geq (t_{A/2sur}, t_{Fe/2})$ were not satisfied, the exerted tension to the steel sheet was insufficient.

In No. 12 where $(t_{A/2}t_{Fe/2}) \geq 1.00$ was not satisfied, the peeling width of coating and the bend and stripping diameter were large, and the coating adhesion was inferior.

In Nos. 14, 17 and 23 where $0.25 \geq (t_{A/2sur}, t_{Fe/2})$ was not satisfied, the exerted tension to the steel sheet was insufficient.

Test Example 2

<Production of Grain Oriented Electrical Steel Sheet>

Each specimen of grain oriented electrical steel sheet comprising the coating A and the coating B in this order on the steel sheet was produced as explained below.

First, in the same manner as in Test Example 1, the steel sheet having the coating A (forsterite coating) was obtained.

Next, a coating liquid containing phosphoric acid, colloidal silica and a metal compound was prepared. The phosphoric acid content was 0.5 mol/L in terms of $P_2O_5$. The colloidal silica content was 1.5 mol/L in terms of $Si_2$. The metal compound content was calculated in terms of its metal oxide shown in Table 2 below and was set to the content (unit: mol/L) shown in the table.

The prepared coating liquid was applied to the surface of the obtained steel sheet having the coating A and baked. The application and the baking were performed twice. In this manner, two layers of the coating B containing silicophosphate glass as the glassy substance were formed on the coating A.

As the colloidal silica contained in the coating liquid, a colloidal silica "AT-300" (Na content: 0.55 mass %) manufactured by ADEKA CORPORATION was used in the first layer of the coating B, while in the second layer of the coating B, a colloidal silica "AT-20N" (Na content: 0.03 mass %) manufactured by ADEKA CORPORATION was used.

The first and second layers of the coating B were both baked under the conditions of 900° C. for 30 seconds in a nitrogen atmosphere.

The thickness of the coating B (one side, unit: μm) was set as shown in Table 2 below. The thickness was assessed through cross-sectional SEM observation.

<Measurement of Element Profile>

In the same manner as in Test Example 1, of the produced specimen of grain oriented electrical steel sheet, the half-value time $t_{Fe/2}$ in a profile of Fe as well as the peak time $t_A$ and the half-value time $t_{A/2}$ ($t_{A/2sur}$, $t_{A/2met}$) in a profile of alkali metal element (Na) were determined. In addition, $t_A/t_{Fe/2}$, $t_{A/2sur}/t_{Fe/2}$ and $t_{A/2met}/t_{Fe/2}$ were found. The results are shown in Table 2 below.

<Evaluation>

In the same manner as in Test Example 1, the peeling width of coating, the bend and stripping diameter and the exerted tension of the produced specimen of grain oriented electrical steel sheet were determined. The results are shown in Table 2 below.

In addition, the interlaminar insulation resistance and the lamination factor of the produced specimen of grain oriented electrical steel sheet were measured according to JIS C 2550. The interlaminar insulation resistance was assessed based on a current value (Franklin current value). The results are shown in Table 2 below.

TABLE 2

| | Coating B | | | | | | | | | | | Coating thickness (one side) | | |
|---|---|---|---|---|---|---|---|---|---|---|---|---|---|---|
| No. | MgO | $Al_2O_3$ | CaO | $TiO_2$ | $Nd_2O_3$ | $MoO_2$ [mol/L] | $CrO_3$ | $B_2O_3$ | $Ta_2O_5$ | CuO | MnO | 1st layer [μm] | 2nd layer [μm] | $t_A$ [s] |
| 1 | 0.50 | 0.00 | 0.00 | 0.00 | 0.00 | 0.00 | 0.10 | 0.00 | 0.00 | 0.00 | 0.00 | 0.1 | 1.9 | 55.3 |
| 2 | 0.50 | 0.00 | 0.00 | 0.00 | 0.00 | 0.00 | 0.10 | 0.00 | 0.00 | 0.00 | 0.00 | 0.2 | 1.8 | 50.8 |
| 3 | 0.50 | 0.00 | 0.00 | 0.00 | 0.00 | 0.00 | 0.10 | 0.00 | 0.00 | 0.00 | 0.00 | 0.5 | 1.5 | 31.4 |
| 4 | 0.50 | 0.00 | 0.00 | 0.00 | 0.00 | 0.00 | 0.00 | 0.00 | 0.00 | 0.00 | 0.00 | 1.5 | 0.5 | 23.9 |
| 5 | 0.50 | 0.00 | 0.00 | 0.00 | 0.00 | 0.00 | 0.00 | 0.20 | 0.00 | 0.00 | 0.00 | 0.2 | 0.7 | 26.7 |
| 6 | 0.50 | 0.00 | 0.00 | 0.18 | 0.00 | 0.00 | 0.00 | 0.00 | 0.00 | 0.00 | 0.00 | 0.3 | 1.2 | 33.2 |
| 7 | 0.30 | 0.00 | 0.00 | 0.20 | 0.00 | 0.00 | 0.00 | 0.00 | 0.00 | 0.00 | 0.00 | 0.4 | 1.6 | 40.2 |
| 8 | 0.40 | 0.00 | 0.00 | 0.20 | 0.00 | 0.00 | 0.00 | 0.00 | 0.00 | 0.00 | 0.00 | 1.0 | 3.0 | 70.5 |
| 9 | 0.60 | 0.00 | 0.00 | 0.00 | 0.00 | 0.00 | 0.15 | 0.00 | 0.00 | 0.00 | 0.00 | 0.6 | 5.4 | 90.8 |
| 10 | 0.70 | 0.00 | 0.00 | 0.00 | 0.00 | 0.00 | 0.00 | 0.00 | 0.00 | 0.00 | 0.00 | 0.5 | 3.5 | 74.1 |
| 11 | 0.45 | 0.00 | 0.10 | 0.00 | 0.00 | 0.00 | 0.00 | 0.00 | 0.00 | 0.00 | 0.00 | 0.8 | 7.2 | 126.0 |
| 12 | 0.25 | 0.25 | 0.00 | 0.00 | 0.00 | 0.10 | 0.00 | 0.00 | 0.00 | 0.00 | 0.00 | 0.2 | 1.4 | 43.0 |
| 13 | 0.25 | 0.25 | 0.00 | 0.00 | 0.10 | 0.00 | 0.00 | 0.00 | 0.00 | 0.00 | 0.00 | 0.3 | 1.8 | 35.9 |
| 14 | 0.00 | 0.00 | 0.00 | 0.00 | 0.00 | 0.10 | 0.00 | 0.00 | 0.00 | 0.50 | 0.00 | 0.5 | 2.5 | 38.4 |
| 15 | 0.00 | 0.17 | 0.00 | 0.00 | 0.00 | 0.00 | 0.10 | 0.00 | 0.00 | 0.00 | 0.00 | 0.3 | 1.7 | 49.3 |
| 16 | 0.00 | 0.15 | 0.00 | 0.00 | 0.00 | 0.00 | 0.10 | 0.00 | 0.00 | 0.00 | 0.00 | 1.5 | 0.2 | 10.5 |
| 17 | 0.00 | 0.25 | 0.00 | 0.00 | 0.00 | 0.00 | 0.00 | 0.00 | 0.00 | 0.00 | 0.00 | 0.3 | 1.5 | 36.6 |
| 18 | 0.00 | 0.17 | 0.00 | 0.10 | 0.00 | 0.00 | 0.00 | 0.00 | 0.00 | 0.00 | 0.00 | 0.3 | 2.8 | 62.2 |
| 19 | 0.25 | 0.00 | 0.25 | 0.00 | 0.00 | 0.00 | 0.00 | 0.10 | 0.00 | 0.00 | 0.00 | 1.0 | 2.0 | 45.0 |
| 20 | 0.00 | 0.00 | 0.00 | 0.00 | 0.00 | 0.00 | 0.00 | 0.00 | 0.00 | 0.10 | 0.30 | 2.3 | 0.2 | 12.8 |
| 21 | 0.25 | 0.25 | 0.00 | 0.00 | 0.00 | 0.00 | 0.20 | 0.00 | 0.00 | 0.00 | 0.00 | 0.7 | 2.5 | 36.7 |

TABLE 2-continued

| | $t_{A/2}$ [s] | | | | | | Peeling width of coating [mm] | Bend and strippping diameter [mm] | Franklin current [A] | Lamination factor [%] | Exerted tension [MPa] | Remarks |
|---|---|---|---|---|---|---|---|---|---|---|---|---|
| No. | $t_{A/2sur}$ [s] | $t_{A/2met}$ [s] | $t_{Fe/2}$ [s] | $t_A/t_{Fe/2}$ | $t_{A/2sur}/t_{Fe/2}$ | $t_{A/met}/t_{Fe/2}$ | | | | | | |
| 1 | 50.2 | 59.2 | 68.3 | 0.81 | 0.73 | 0.87 | 3.3 | 40 | 0.03 | 97.54 | 12.8 | CE |
| 2 | 45.3 | 55.6 | 71.0 | 0.72 | 0.64 | 0.78 | 0.9 | 30 | 0.02 | 97.53 | 12.9 | EX |
| 3 | 28.0 | 53.7 | 70.8 | 0.44 | 0.40 | 0.76 | 0.3 | 30 | 0.02 | 97.49 | 12.8 | EX |
| 4 | 17.8 | 55.1 | 66.7 | 0.36 | 0.27 | 0.83 | 0.6 | 30 | 0.03 | 97.69 | 12.3 | EX |
| 5 | 21.9 | 42.3 | 55.5 | 0.48 | 0.39 | 0.76 | 0.8 | 30 | 0.13 | 98.29 | 8.0 | EX |
| 6 | 28.4 | 42 | 58.5 | 0.57 | 0.49 | 0.72 | 0.6 | 30 | 0.08 | 97.82 | 10.6 | EX |
| 7 | 36.7 | 51.8 | 69.4 | 0.58 | 0.53 | 0.75 | 0.5 | 30 | 0.03 | 97.46 | 13.0 | EX |
| 8 | 64.1 | 87.4 | 100.9 | 0.70 | 0.64 | 0.87 | 0.7 | 30 | 0.01 | 95.85 | 20.3 | EX |
| 9 | 66.4 | 116 | 129.1 | 0.70 | 0.51 | 0.90 | 0.5 | 30 | 0.00 | 94.52 | 25.6 | EX |
| 10 | 68.0 | 86.4 | 102.3 | 0.72 | 0.66 | 0.84 | 0.7 | 30 | 0.01 | 96.13 | 19.8 | EX |
| 11 | 116.6 | 141.2 | 161.1 | 0.78 | 0.72 | 0.88 | 3.2 | 40 | 0.00 | 92.93 | 28.1 | CE |
| 12 | 39.2 | 48.6 | 58.8 | 0.73 | 0.67 | 0.83 | 0.8 | 30 | 0.06 | 97.77 | 11.6 | EX |
| 13 | 30.8 | 58.9 | 66.6 | 0.54 | 0.46 | 0.88 | 0.9 | 30 | 0.03 | 97.62 | 13.1 | EX |
| 14 | 32.1 | 74.4 | 84.2 | 0.46 | 0.38 | 0.88 | 0.6 | 30 | 0.01 | 96.81 | 15.6 | EX |
| 15 | 43.0 | 56.7 | 69.1 | 0.71 | 0.62 | 0.82 | 1.0 | 30 | 0.03 | 97.56 | 13.4 | EX |
| 16 | 0.3 | 51.6 | 62.6 | 0.17 | 0.00 | 0.82 | 0.9 | 30 | 0.02 | 97.90 | 6.3 | CE |
| 17 | 30.6 | 56.6 | 68.3 | 0.54 | 0.45 | 0.83 | 0.8 | 30 | 0.03 | 97.79 | 12.1 | EX |
| 18 | 59.2 | 76.2 | 85.9 | 0.72 | 0.69 | 0.89 | 0.9 | 30 | 0.01 | 96.59 | 15.2 | EX |
| 19 | 42.7 | 71.3 | 83.2 | 0.54 | 0.51 | 0.86 | 0.3 | 30 | 0.01 | 96.87 | 14.9 | EX |
| 20 | 0.6 | 62.7 | 73.7 | 0.17 | 0.01 | 0.85 | 1.0 | 30 | 0.02 | 97.08 | 7.0 | CE |
| 21 | 34.6 | 75.4 | 87.2 | 0.42 | 0.40 | 0.87 | 0.4 | 30 | 0.03 | 96.62 | 15.2 | EX |

CE = Comparative Example
EX = Example

Table 2 above revealed that, when $0.35 \geq (t_A/t_{Fe/2}) \geq 0.75$ and $0.25 \geq (t_{A/2}t_{Fe/2}) \geq 1.00$ were satisfied, the peeling width of coating and the bend and stripping diameter were so small that the coating adhesion was excellent, and, in addition, the exerted tension to the steel sheet was high.

As to the coating B, it was observed that the exerted tension to the steel sheet would tend to become higher as the thickness increased.

On the other hand, in Nos. 1 and 11 where $(t_A/t_{Fe/2}) \geq 0.75$ was not satisfied, the coating adhesion was inferior.

In Nos. 16 and 20 where $0.35 \geq (t_A/t_{Fe/2})$ and $0.25 \geq (t_{A/2sur}t_{Fe/2})$ were not satisfied, the exerted tension to the steel sheet was insufficient.

Test Example 3

<Production of Grain Oriented Electrical Steel Sheet>

Each specimen of grain oriented electrical steel sheet comprising the coating A and the coating B in this order on the steel sheet was produced as explained below.

First, prepared was a silicon steel slab containing, in percentage by mass, Si in an amount of 3.3%, C in an amount of 0.06%, Mn in an amount of 0.08%, S in an amount of 0.001%, Al in an amount of 0.015%, N in an amount of 0.006%, Cu in an amount of 0.05% and Sb in an amount of 0.01%.

The silicon steel slab was heated at 1,100° C. for 30 minutes and thereafter subjected to hot rolling, whereby a hot rolled steel sheet with a thickness of 2.2 mm was obtained. The obtained hot rolled steel sheet was subjected to annealing at 1,000° C. for 1 minute and thereafter subjected to cold rolling, whereby a cold rolled steel sheet with a final thickness of 0.23 mm was obtained. Thereafter, the cold rolled steel sheet was exposed to an elevated temperature from room temperature to 820° C. at a heating rate of 20° C./s and was subjected to the primary recrystallization annealing in a wet atmosphere at 820° C. for 60 seconds. Next, an annealing separator obtained by mixing 150 parts by mass of $Al_2O_3$ and 1 part by mass of $Na_2B_4O_7 \cdot 10H_2O$ with 50 parts by mass of MgO was made into a water slurry form and applied to the surface of the cold rolled steel sheet having been subjected to the primary recrystallization annealing. The cold rolled steel sheet was then dried. The cold rolled steel sheet after being dried was exposed to an elevated temperature from 300° C. to 800° C. in 100 hours and thereafter elevated to 1,200° C. at a heating rate of 50° C./hr, and was subjected to the finishing annealing at 1,200° C. for 5 hours. Accordingly, the coating A containing cordierite ($2MgO \cdot 2Al_2O_3 \cdot 5SiO_2$) as the crystalline substance was formed, and the steel sheet (coil) having the coating A was obtained. A specimen of 100 mm (direction perpendicular to rolling direction)×400 mm (rolling direction) in size was sampled from the center part of the obtained coil.

In some of the specimens, the coating A (cordierite coating) was removed using a mixed acid of sulfuric acid and hydrofluoric acid and the coating A (nitride coating) containing a nitride shown in Table 3 below as the crystalline substance was formed through the PVD method.

The thickness of the coating A (unit: μm) is shown in Table 3 below.

The crystalline substance content of the coating A was not less than 80 mass % in any specimen.

Next, a glass frit manufactured by Asahi Glass Co., Ltd. shown in Table 3 below was applied to the surface of the steel sheet having the coating A and baked, whereby the coating B was formed. The glass frit had a large grain size and was hence ground with a ball mill to be adjusted to the mean particle size of 1.0 μm and then used.

The application and baking were performed twice to form the coating B consisted of two layers. When the first layer of the coating B was formed, 0.2 mass % of KOH was blended with the glass frit.

The first and second layers of the coating B were both baked under the conditions of 1,000° C. for 10 minutes in a nitrogen atmosphere.

The thickness of the coating B (one side, unit: μm) was set as shown in Table 3 below. The thickness was assessed through cross-sectional SEM observation.

<Measurement of Element Profile>

In the same manner as in Test Example 1, of the produced specimen of grain oriented electrical steel sheet, the half-value time $t_{Fe/2}$ in a profile of Fe as well as the peak time $t_A$ and the half-value time $t_{A/2}$ ($t_{A/2sur}$, $t_{A/2met}$) in a profile of alkali metal element (K) were determined. In addition, $t_A/t_{Fe/2}$, $t_{A/2sur}/t_{Fe/2}$ and $t_{A/2met}/t_{Fe/2}$ were found. The results are shown in Table 3 below.

<Evaluation>

In the same manner as in Test Example 1, the peeling width of coating, the bend and stripping diameter and the exerted tension of the produced specimen of grain oriented electrical steel sheet were determined. In addition, the interlaminar insulation resistance (Franklin current value) and the lamination factor were determined in the same manner as in Test Example 2. The results are shown in Table 3 below.

As to the coating B, it was observed that the exerted tension to the steel sheet would tend to become higher as the thickness increased.

On the other hand, in No. 2 where $(t_{A/2}t_{Fe/2}) \geq 1.00$ was not satisfied, the coating adhesion was inferior.

In Nos. 3, 8, 9 and 10 where $0.35 \geq (t_A/t_{Fe/2})$ and/or $0.25 \geq (t_{A/2sur}t_{Fe/2})$ was not satisfied, the exerted tension to the steel sheet was insufficient.

In No. 6 where $(t_A/t_{Fe/2}) \geq 0.75$ was not satisfied, the peeling width of coating and the bend and stripping diameter were large, and the coating adhesion was inferior.

The invention claimed is:

1. A grain oriented electrical steel sheet comprising a steel sheet, a coating A disposed on the steel sheet and containing a crystalline substance, and a coating B disposed on the coating A, wherein the coating B is an insulation tension coating, and wherein element profiles acquired in a direction from the coating B toward the steel sheet using radio frequency glow discharge optical emission spectroscopy satisfy formulae (1) and (2) below, $$0.35 \geq (t_A/t_{Fe/2}) \geq 0.75 \quad (1)$$

$$0.25 \geq (t_{A/2}t_{Fe/2}) \geq 1.00 \quad (2)$$

TABLE 3

| | Coating A | | Coating B | | | | | | | |
|---|---|---|---|---|---|---|---|---|---|---|
| | | | | Glass frit | | Coating thickness (one side) | | $t_{A/2}$ [s] | | |
| No. | Crystalline substance | Coating thickness [μm] | Trade name | Composition | 1st layer [μm] | 2nd layer [μm] | $t_A$ [s] | $t_{A/2sur}$ [s] | $t_{A/2met}$ [s] | $t_{Fe/2}$ [s] |
| 1 | Cordierite | 2.00 | JP-1 | PbO•SiO$_2$ | 0.5 | 2.0 | 36.2 | 26.5 | 56.3 | 74.6 |
| 2 | Cordierite | 2.00 | ASF-1780 | SiO$_2$•B$_2$O$_3$•BaO | 2.0 | 2.0 | 34.5 | 23.1 | 90.1 | 89.4 |
| 3 | Cordierite | 2.00 | ASF-102M | SiO$_2$•B$_2$O$_3$ | 3.0 | 2.0 | 30.8 | 21.6 | 71.2 | 96.3 |
| 4 | AlN | 0.50 | ASF-102M | SiO$_2$•B$_2$O$_3$ | 0.5 | 2.0 | 45.6 | 33.0 | 53.8 | 76.8 |
| 5 | TiN | 0.20 | HHR0704 | SiO$_2$•ZnO•BaO | 0.5 | 2.0 | 44.1 | 36.4 | 51.5 | 74.5 |
| 6 | TiN | 0.50 | HHR0704 | SiO$_2$•ZnO•BaO | 0.5 | 3.0 | 66.8 | 60.9 | 72.3 | 85.1 |
| 7 | TiN | 1.00 | HHR0704 | SiO$_2$•ZnO•BaO | 0.3 | 2.0 | 54.7 | 50.0 | 63.9 | 73.4 |
| 8 | TiN | 2.00 | ASF-1780 | SiO$_2$•B$_2$O$_3$•BaO | 0.5 | 1.0 | 36.8 | 15.8 | 55.4 | 66.1 |
| 9 | CrN | 0.50 | ASF-1780 | SiO$_2$•B$_2$O$_3$•BaO | 2.0 | 1.0 | 19.8 | 2.6 | 68.6 | 74.8 |
| 10 | AlCrN | 0.50 | ASF-1780 | SiO$_2$•B$_2$O$_3$•BaO | 1.0 | 0.5 | 15.8 | 1.3 | 59.6 | 64.1 |
| 11 | AlTiN | 0.50 | HHR0704 | SiO$_2$•ZnO•BaO | 2.0 | 0.5 | 35.7 | 24.7 | 43.1 | 75.6 |
| 12 | AlN/TiN | 0.20/0.30 | HHR0704 | SiO$_2$•ZnO•BaO | 3.0 | 0.5 | 54.4 | 48.3 | 59.2 | 83.3 |
| 13 | CrN/TiN | 0.20/0.30 | HHR0704 | SiO$_2$•ZnO•BaO | 2.0 | 3.0 | 67.3 | 39.6 | 73.4 | 97.9 |

| No. | $t_A/t_{Fe/2}$ | $t_{A/2sur}/t_{Fe/2}$ | $t_{A/2met}/t_{Fe/2}$ | Peeling width of coating [mm] | Bend and stripping diameter [mm] | Franklin current [A] | Lamination factor [%] | Exerted tension [MPa] | Remarks |
|---|---|---|---|---|---|---|---|---|---|
| 1 | 0.49 | 0.36 | 0.75 | 0.5 | 30 | 0.03 | 96.93 | 12.8 | EX |
| 2 | 0.39 | 0.26 | 1.01 | 3.2 | 50 | 0.01 | 95.69 | 16.2 | CE |
| 3 | 0.32 | 0.22 | 0.74 | 0.4 | 30 | 0.01 | 94.63 | 7.3 | CE |
| 4 | 0.59 | 0.43 | 0.70 | 0.9 | 30 | 0.02 | 96.64 | 12.9 | EX |
| 5 | 0.59 | 0.49 | 0.69 | 0.3 | 30 | 0.02 | 96.95 | 12.8 | EX |
| 6 | 0.79 | 0.72 | 0.85 | 3.0 | 40 | 0.02 | 95.91 | 14.3 | CE |
| 7 | 0.75 | 0.68 | 0.87 | 0.3 | 30 | 0.02 | 97.02 | 12.3 | EX |
| 8 | 0.56 | 0.24 | 0.84 | 0.3 | 30 | 0.04 | 97.78 | 6.0 | CE |
| 9 | 0.26 | 0.03 | 0.92 | 0.6 | 30 | 0.03 | 97.09 | 6.4 | CE |
| 10 | 0.25 | 0.02 | 0.93 | 0.4 | 30 | 0.08 | 98.00 | 5.3 | CE |
| 11 | 0.47 | 0.33 | 0.57 | 0.3 | 30 | 0.04 | 97.40 | 12.7 | EX |
| 12 | 0.65 | 0.58 | 0.71 | 0.2 | 30 | 0.03 | 96.35 | 14.9 | EX |
| 13 | 0.69 | 0.40 | 0.75 | 0.6 | 30 | 0.03 | 95.13 | 18.2 | EX |

CE = Comparative Example
EX = Example

Table 3 above revealed that, when $0.35 \geq (t_A/t_{Fe/2}) \geq 0.75$ and $0.25 \geq (t_{A/2}t_{Fe/2}) \geq 1.00$ were satisfied, the peeling width of coating and the bend and stripping diameter were so small that the coating adhesion was excellent, and, in addition, the exerted tension to the steel sheet was high.

where $t_A$ represents a peak time in a profile of an alkali metal element, $t_{A/2}$ represents a half-value time in a profile of an alkali metal element, and $t_{Fe/2}$ represents a half-value time in a profile of Fe.

2. The grain oriented electrical steel sheet according to claim 1, wherein the crystalline substance contained in the coating A is an oxide.

3. The grain oriented electrical steel sheet according to claim 2, wherein the oxide is at least one type selected from the group consisting of forsterite and cordierite.

4. The grain oriented electrical steel sheet according to claim 3, wherein the alkali metal element is at least one type selected from the group consisting of Na and K.

5. The grain oriented electrical steel sheet according to claim 2, wherein the alkali metal element is at least one type selected from the group consisting of Na and K.

6. The grain oriented electrical steel sheet according to claim 1, wherein the crystalline substance contained in the coating A is a nitride.

7. The grain oriented electrical steel sheet according to claim 6, wherein the nitride is at least one type selected from the group consisting of titanium nitride, aluminum nitride and chromium nitride.

8. The grain oriented electrical steel sheet according to claim 7, wherein the alkali metal element is at least one type selected from the group consisting of Na and K.

9. The grain oriented electrical steel sheet according to claim 6, wherein the alkali metal element is at least one type selected from the group consisting of Na and K.

10. The grain oriented electrical steel sheet according to claim 1, wherein the alkali metal element is at least one type selected from the group consisting of Na and K.

11. A method of manufacturing the grain oriented electrical steel sheet according to claim 1, the method comprising:
   a step of obtaining the steel sheet having the coating A, the coating A being disposed on the steel sheet; and
   a step of forming the coating B on the coating A of the steel sheet having the coating A,
   wherein, prior to formation of the coating B, the steel sheet having the coating A is immersed in an aqueous solution of an alkali metal compound, subsequently washed with water and dried, and
   wherein, in the steel sheet having the coating A after being dried, a coating amount of the alkali metal compound calculated in terms of alkali metal element on both sides is not less than $1.0 \times 10^{-5}$ mol/m$^2$.

12. The method of manufacturing the grain oriented electrical steel sheet according to claim 11, wherein the coating amount is not more than $1.0 \times 10^{-2}$ mol/m$^2$.

* * * * *